United States Patent
Kato

(10) Patent No.: US 9,668,353 B2
(45) Date of Patent: May 30, 2017

(54) ELECTRONIC COMPONENT WITH BUILT-IN CAPACITOR

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 100 days.

(21) Appl. No.: 14/862,317

(22) Filed: Sep. 23, 2015

(65) Prior Publication Data

US 2016/0014903 A1 Jan. 14, 2016

Related U.S. Application Data

(63) Continuation of application No. PCT/JP2014/070004, filed on Jul. 30, 2014.

(30) Foreign Application Priority Data

Sep. 5, 2013 (JP) ................. 2013-183648

(51) Int. Cl.
*H05K 1/18* (2006.01)
*H05K 1/02* (2006.01)
(Continued)

(52) U.S. Cl.
CPC ............. *H05K 1/189* (2013.01); *H01G 4/228* (2013.01); *H01G 4/30* (2013.01); *H01G 4/40* (2013.01);
(Continued)

(58) Field of Classification Search
CPC ...... H05K 1/189; H05K 1/0298; H05K 1/162; H05K 1/165; H05K 1/184; H05K 3/4691;
(Continued)

(56) References Cited

U.S. PATENT DOCUMENTS 6,323,096 B1 † 11/2001 Saia
2004/0017670 A1 1/2004 Bando
(Continued)

FOREIGN PATENT DOCUMENTS

CN 101631432 A † 1/2010
JP 4-280496 A 10/1992
(Continued)

OTHER PUBLICATIONS

Official Communication issued in International Patent Application No. PCT/JP2014/070004, mailed on Oct. 28, 2014.

*Primary Examiner* — Eric Thomas
*Assistant Examiner* — Michael P McFadden
(74) *Attorney, Agent, or Firm* — Keating & Bennett, LLP

(57) ABSTRACT

A capacitor element includes a plurality of flexible base material layers that are stacked upon each other, and conductor patterns that are provided on the flexible base material layers and that define a capacitor. The capacitor element also includes a flexible portion, and a rigid portion having a larger number of stacked flexible base material layers than the flexible portion. Conductor pattern pairs that define the capacitor are provided in both the flexible portion and the rigid portion. The conductor pattern pair that is provided in the rigid portion is connected in series with the conductor pattern pair that is provided in the flexible portion. The conductor pattern pair that is provided in the rigid portion has a larger number of tiers than the conductor pattern pair that is provided in the flexible portion.

20 Claims, 16 Drawing Sheets

(51) Int. Cl.
*H01G 4/28* (2006.01)
*H01G 4/30* (2006.01)
*H01G 4/40* (2006.01)
*H05K 1/16* (2006.01)
*H05K 3/46* (2006.01)
*H01G 4/228* (2006.01)
*H03H 1/00* (2006.01)
*H05K 7/02* (2006.01)
*H05K 1/14* (2006.01)
*H03H 7/01* (2006.01)

(52) U.S. Cl.
CPC ............. *H03H 1/00* (2013.01); *H05K 1/0298*
(2013.01); *H05K 1/162* (2013.01); *H05K*
*1/165* (2013.01); *H05K 1/184* (2013.01);
*H05K 3/4691* (2013.01); *H05K 7/023*
(2013.01); *H03H 7/0115* (2013.01); *H03H*
*2001/0021* (2013.01); *H03H 2001/0085*
(2013.01); *H05K 1/148* (2013.01); *H05K*
*2201/042* (2013.01); *H05K 2201/09263*
(2013.01); *H05K 2201/1003* (2013.01); *H05K*
*2201/10015* (2013.01); *H05K 2201/10098*
(2013.01)

(58) Field of Classification Search
CPC .. H05K 7/023; H05K 1/148; H05K 2201/042;
H05K 2201/09263; H05K 2201/10015;
H05K 2201/1003; H05K 2201/10098;
H01G 4/228; H01G 4/30; H01G 4/40;
H03H 1/00; H03H 7/0115; H03H
2001/0021; H03H 2001/0085
USPC ....................................................... 361/301.1
See application file for complete search history.

(56) References Cited

U.S. PATENT DOCUMENTS

| 2008/0047743 | A1* | 2/2008 | Komatsu | H05B 41/2822 |
| | | | | 174/260 |
| 2008/0248258 | A1† | 10/2008 | Hao | |
| 2012/0228005 | A1* | 9/2012 | Chisaka | H05K 3/4691 |
| | | | | 174/250 |
| 2014/0057087 | A1* | 2/2014 | Adachi | H01G 4/30 |
| | | | | 428/212 |

FOREIGN PATENT DOCUMENTS

| JP | 7-336005 A | | 12/1995 |
| JP | 2004-63664 A | | 2/2004 |
| JP | 2005-116938 A | | 4/2005 |
| JP | 2012-134490 | † | 7/2012 |
| WO | 2009/014126 A1 | | 1/2009 |
| WO | 2012/157300 A1 | | 11/2012 |

\* cited by examiner
† cited by third party

ELECTRONIC COMPONENT WITH BUILT-IN CAPACITOR

BACKGROUND OF THE INVENTION

1. Field of the Invention

The present invention relates to an electronic component with a built-in capacitor including a plurality of base material layers that are stacked upon each other.

2. Description of the Related Art

Hitherto, electronic components with a built-in capacitor including a plurality of base material layers that are stacked upon each other have been known (refer to, for example, Japanese Unexamined Patent Application Publication No. 7-336005). Japanese Unexamined Patent Application Publication No. 7-336005 discloses a flexible printed circuit board including a plurality of base material layers that are stacked upon each other and a plurality of conductor patterns that extend in straight lines and that are disposed adjacent to each other in the same layer. In the flexible printed circuit board, at one end portion of the conductor patterns, an upper electrode is provided so as to oppose the conductor patterns with a dielectric being interposed therebetween; or, at two end portions of the conductor patterns, upper electrodes are provided so as to oppose the conductor patterns with each dielectric being interposed between the corresponding upper electrode and the conductor patterns. The conductor patterns and the upper electrode form a conductor pair to form a capacitor, or the conductor patterns and the upper electrodes form conductor pairs to form capacitors.

In the flexible printed circuit board in Japanese Unexamined Patent Application Publication No 7-336005, it may be difficult for the capacitor or capacitors to have high capacitance because it is difficult to increase an opposing area between the conductor patterns and the upper electrode or the upper electrodes (opposing area of the conductor pair or conductor pairs) without increasing the size of the flexible printed circuit board in plan view.

SUMMARY OF THE INVENTION

Preferred embodiments of the present invention provide an electronic component with a built-in capacitor which is capable of achieving high capacitor capacitance.

According to an aspect of various preferred embodiments of the present invention, an electronic component with a built-in capacitor includes a plurality of flexible base material layers that are stacked upon each other; and conductor patterns that are provided on the flexible base material layers and that define a capacitor. The electronic component with a built-in capacitor also includes a flexible portion; and a thick-walled portion having a larger number of stacked flexible base material layers than the flexible portion. In both the flexible portion and the thick-walled portion, conductor pattern pairs that define the capacitor are provided when the conductor patterns oppose each other with a corresponding one of the flexible base material layers being interposed between opposing ones of the conductor patterns. The conductor pattern pair that is provided in the thick-walled portion is connected in series with the conductor pattern pair that is provided in the flexible portion. The conductor pattern pair that is provided in the thick-walled portion preferably has a larger number of tiers than the conductor pattern pair that is provided in the flexible portion.

In this structure, since conductor pattern pairs are provided in both the flexible portion and the thick-walled portion and the conductor pattern pair provided in the thick-walled portion has a larger number of tiers than the conductor pattern pair in the flexible portion, it is possible to sufficiently increase the opposing area of the conductor pairs while suppressing or preventing a reduction in the flexibility of the flexible portion. As a result, it is possible for the capacitor to have high capacitance.

It is desirable that the conductor pattern pair that is provided in the flexible portion be disposed so as to extend from the flexible portion to the thick-walled portion, and the conductor pattern pair that is provided in the flexible portion define a portion of the conductor pattern pair that is provided in the thick-walled portion.

In this structure, it is possible to increase the strength at a boundary between the flexible portion and the thick-walled portion.

It is desirable that the flexible portion be belt-shaped, and, as viewed from a stacking direction, the flexible portion be provided with the conductor pattern pair over substantially an entire region in a longitudinal direction of the flexible portion.

In this structure, it is possible to further increase the capacitance of the capacitor.

It is desirable for the electronic component with a built-in capacitor according to a preferred embodiment of the present invention to have the following structure. That is, at least two of the thick-walled portions are provided. In addition, the flexible portion is disposed between the at least two thick-walled portions so as to connect the at least two thick-walled portions to each other. Further, an external connection terminal is provided in each of the at least two thick-walled portions.

In this structure, it is possible to use the flexible portion as a flat cable including external connection terminals at two end portions.

It is desirable that a portion of the conductor pattern pair that is provided in the thick-walled portion defines an external connection terminal.

In this structure, since portions of the conductor patterns that define the external connection terminals are also used to define the capacitor, it is possible for the capacitor to have higher capacitance.

It is desirable that the electronic component with a built-in capacitor further include a coil, wherein the capacitor and the coil define an LC circuit.

In this structure, it is possible to provide an LC circuit including a capacitor having high capacitance.

It is desirable that an electronic component be mounted on or built in the thick-walled portion or each thick-walled portion.

In this structure, since an electronic component is able to be provided without increasing the wall thickness of the flexible portion, it is possible to use the electronic component with a built-in capacitor as a module component while maintaining the flexibility of the flexible portion. In addition, by disposing the electronic component in the thick-walled portion that is more rigid than the flexible portion, it is possible to suppress or prevent the occurrence of improper joining or detachment of the electronic component caused by deformation of the base material.

According to various preferred embodiments of the present invention, it is possible to provide an electronic component with a built-in capacitor including a capacitor having high capacitance.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
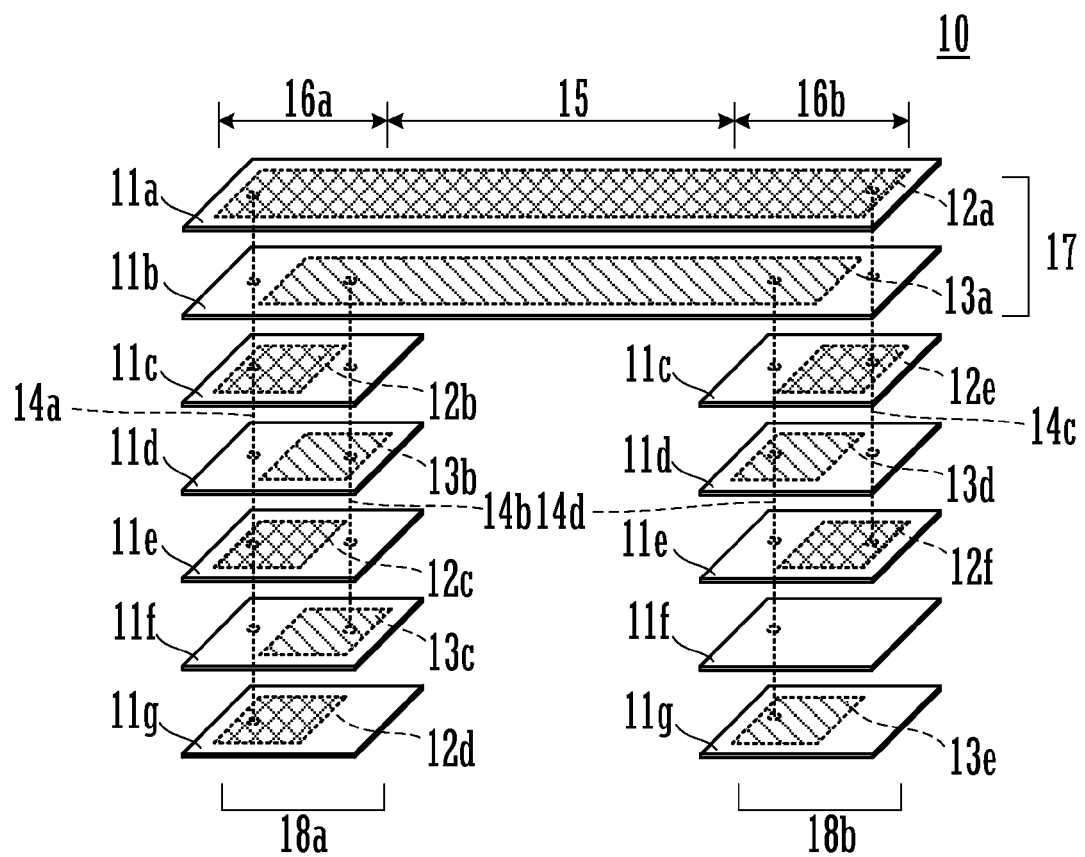
FIG. 1 is an exploded perspective view of a capacitor element according to a first preferred embodiment of the present invention.
Figure 2:
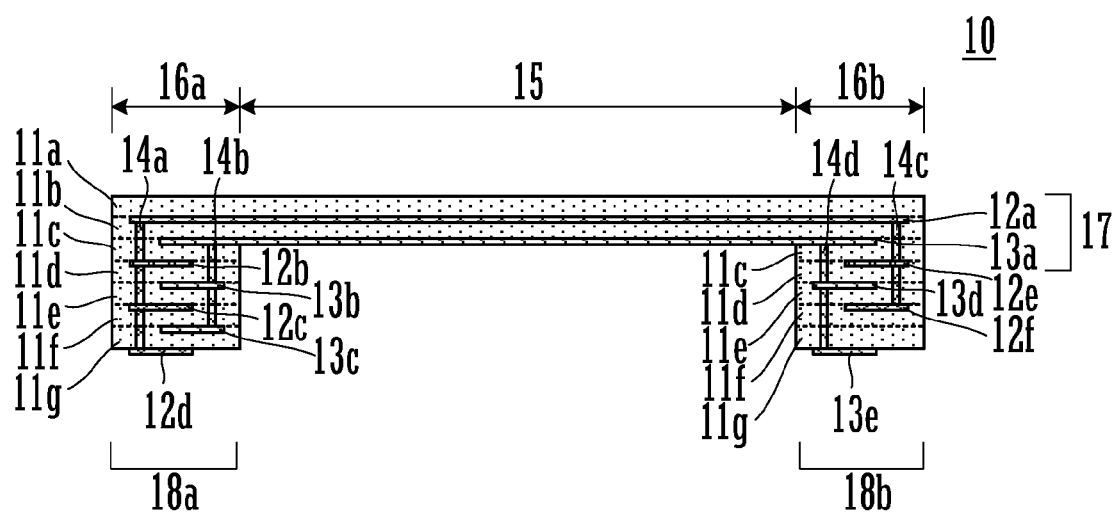
FIG. 2 is a sectional view of the capacitor element according to the first preferred embodiment of the present invention.

A capacitor element 10 according to a first preferred embodiment of the present invention is described. The capacitor element 10 is an example of an electronic component with a built-in capacitor according to a preferred embodiment of the present invention. FIG. 1 is an exploded perspective view of the capacitor element 10. FIG. 2 is a sectional view of the capacitor element 10. The capacitor element 10 includes flexible base material layers 11a to 11g, rectangular or substantially rectangular flat conductor patterns 12a to 12f, rectangular or substantially rectangular flat conductor patterns 13a to 13e, and via conductors 14a to 14d. The flexible base material layers 11a to 11g are each preferably made of, for example, thermoplastic resin, such as liquid crystal polymer (LCP). The conductor patterns 12a to 12f and the conductor patterns 13a to 13e are each preferably made of, for example, a metallic film, such as a copper foil.

With the flexible base material layer 11a being the uppermost layer and the flexible base material layer 11g being the lowermost layer, the flexible base material layers 11a to 11g are stacked upon each other in that order. The flexible base material layers 11a and 11b are rectangular or substantially rectangular and flat, and are elongated in a longitudinal direction of the capacitor element 10. The flexible base material layers 11c to 11g each include two rectangular or substantially rectangular flat portions that are separated from each other.

The conductor patterns 12a to 12f and the conductor patterns 13a to 13e are each provided on a corresponding one of the flexible base material layers 11a to 11g. The conductor patterns 12a to 12f and 13a to 13e oppose each other with a corresponding one of the flexible base material layers 11b to 11g being interposed between opposing ones of the conductor patterns, so that a capacitor is provided. In a flexible portion 15 and rigid portions 16a and 16b (which are described next), conductor pattern pairs that define the capacitor are provided when the conductor patterns oppose each other with a corresponding one of the flexible base material layers being interposed between opposing ones of the conductor patterns.

The capacitor element 10 is divided into the flexible portion 15 and the rigid portions 16a and 16b having a larger number of stacked flexible base material layers than the flexible portion 15. Since the rigid portions 16a and 16b have a larger number of stacked flexible base material layers, the rigid portions 16a and 16b correspondingly have lower flexibility and are harder than the flexible portion 15. The rigid portions 16a and 16b correspond to exemplary thick-walled portions. The thick-walled portion according to a preferred embodiment of the present invention need not be rigid.

The flexible portion 15 is rectangular or substantially rectangular and flat, and is elongated in the longitudinal direction of the capacitor element 10. That is, the flexible portion 15 preferably has a belt shape. The flexible portion 15 is disposed between the two rectangular or substantially rectangular parallelepiped rigid portions 16a and 16b so as to connect the two rigid portions 16a and 16b to each other.

In the flexible portion 15, the two flexible base material layers 11a and 11b are stacked upon each other. In the rigid portions 16a and 16b, the seven flexible base material layers 11a to 11g are stacked upon each other. The flexible base material layers 11a and 11b are each provided in the flexible portion 15 and the rigid portions 16a and 16b. The flexible base material layers 11c to 11g are provided in the rigid portions 16a and 16b.

The conductor pattern 12a is provided on a back surface of the flexible base material layer 11a. The conductor pattern 13a is provided on a back surface of the flexible base material layer 11b. The conductor patterns 12a and 13a are each provided in the flexible portion 15 and the rigid portions 16a and 16b. The conductor patterns 12a and 13a extend over substantially the entire surfaces of the flexible base material layers 11a and 11b, respectively, as viewed from a stacking direction. However, regions where the conductor pattern 13a is not provided remain in end portions in a longitudinal direction of the flexible base material layer 11b. The conductor pattern 13a opposes the conductor pattern 12a with the flexible base material layer 11b being interposed therebetween.

The conductor pattern 12a and the conductor pattern 13a define a conductor pattern pair 17. The conductor pattern pair 17 extends over substantially the entire region in a longitudinal direction of the flexible portion 15 as viewed from the stacking direction. Further, the conductor pattern pair 17 extends over substantially the entire surface of the flexible portion 15 as viewed from the stacking direction. This makes it possible for an opposing area of the conductor pattern pair 17 to be large. The conductor pattern pair 17 is provided in the flexible portion 15, and is disposed from the flexible portion 15 to the rigid portions 16a and 16b. This makes it possible for the strength at a boundary between the flexible portion 15 and the rigid portion 16a and a boundary between the flexible portion 15 and the rigid portion 16b to be high. The conductor pattern pair 17 defines a portion of conductor pattern pairs 18a and 18b (described later) provided in the rigid portions 16a and 16b, respectively. The conductor pattern pairs 18a and 18b are described in detail later.

The conductor pattern 12b is provided on a back surface of the flexible base material layer 11c provided in the rigid portion 16a that is positioned at one end side of the flexible portion 15. The conductor pattern 13b is provided on a back surface of the flexible base material layer 11d provided in the rigid portion 16a. The conductor pattern 12c is provided on a back surface of the flexible base material layer 11e provided in the rigid portion 16a. The conductor pattern 13c is provided on a back surface of the flexible base material layer 11f provided in the rigid portion 16a. The conductor pattern 12d, which functions and defines as an external connection terminal, is provided on a back surface of the flexible base material layer 11g in the rigid portion 16a.

The conductor patterns 12b, 12c, and 12d are disposed towards a side opposite to a side of the flexible portion 15 (outer side) such that their end portions are aligned with an end portion of the conductor pattern 12a in plan view. The conductor patterns 13b and 13c are disposed towards the side of the flexible portion 15 (inner side) such that their end portions are aligned with an end portion of the inner conductor pattern 13a rather than the end portion of the conductor pattern 12a in plan view. The conductor patterns 12b, 12c, 12d, 13b, and 13c preferably have the same shape and size in plan view. That is, adjacent conductor patterns with a flexible base material layer being interposed therebetween in the stacking direction are shifted from each other in the longitudinal direction of the capacitor element 10 as viewed from the stacking direction.

The via conductor 14a that electrically couples the conductor patterns 12a to 12d to each other is provided in regions of the flexible base material layers 11b to 11g (in the rigid portion 16a) towards the side opposite to the flexible portion 15 (regions near the outer side of the capacitor element 10 in the rigid portion 16a). The via conductor 14a provided in the flexible base material layers 11b to 11g is disposed at corresponding positions as viewed from the stacking direction. As viewed from the stacking direction, the via conductor 14a is disposed within the conductor patterns 12a to 12d and is disposed outside of the conductor patterns 13a to 13c.

The via conductor 14b that electrically couples the conductor patterns 13a to 13c to each other is provided in regions of the flexible base material layers 11c to 11f (in the rigid portion 16a) towards the side of the flexible portion 15 (regions near the inner side of the capacitor element 10 in the rigid portion 16a). The via conductor 14b provided in the flexible base material layers 11c to 11f is disposed at corresponding positions as viewed from the stacking direction. As viewed from the stacking direction, the via conductor 14b is disposed within the conductor patterns 13a to 13c and is disposed outside of the conductor patterns 12b and 12c.

The conductor pattern 12b opposes the conductor patterns 13a and 13b. The conductor pattern 12c opposes the conductor patterns 13b and 13c. The conductor pattern 12d opposes the conductor pattern 13c. The conductor patterns 12a to 12d are coupled to each other with the via conductor 14b being interposed therebetween. The conductor patterns 12a to 12d provided in the rigid portion 16a and the conductor patterns 13a to 13c provided in the rigid portion 16a define the conductor pattern pair 18a.

The conductor pattern pair 18a provided in the rigid portion 16a preferably has a larger number of tiers than the conductor pattern pair 17 in the flexible portion 15. More specifically, whereas the conductor pattern pair 17 in the flexible portion 15 has one tier, the conductor pattern pair 18a in the rigid portion 16a preferably has six tiers. This makes it possible for an opposing area of the conductor pattern pair 18a to be large. The conductor pattern pair 18a provided in the rigid portion 16a is connected in series with the conductor pattern pair 17 provided in the flexible portion 15.

The conductor pattern 12e is provided on the back surface of the flexible base material layer 11c in the rigid portion 16b that is positioned at the other end side of the flexible portion 15. The conductor pattern 13d is provided on the back surface of the flexible base material layer 11d formed in the rigid portion 16b. The conductor pattern 12f is provided on the back surface of the flexible base material layer 11e in the rigid portion 16b. The conductor pattern 13e, which defines and functions as an external connection terminal, is provided on the back surface of the flexible base material layer 11g in the rigid portion 16b.

As mentioned above, the conductor pattern 12d, which defines and functions an external connection terminal, is also provided on the back surface of the flexible base material layer 11g in the rigid portion 16a. That is, external connection terminals are provided in the two rigid portions 16a and 16b. The conductor patterns 12d and 13e, that is, a portion of the conductor pattern pair 18a that is provided in the rigid portion 16a and a portion of the conductor pattern pair 18b that is provided in the rigid portion 16b each define an external connection terminal. Accordingly, since external connection terminals are provided in the rigid portions 16a and 16b that are harder than the flexible portion 15, it becomes easier to connect the capacitor element 10 and to increase the reliability with which the capacitor element is connected. The conductor pattern pair 18b is described in detail below.

The conductor patterns 12e and 12f are disposed towards a side opposite to the side of the flexible portion 15 (outer side) such that their end portions are aligned with an end portion of the conductor pattern 12a in plan view. The conductor patterns 13d and 13e are disposed towards the side of the flexible portion 15 (inner side) such that their end portions are aligned with an end portion of the inner conductor pattern 13a rather than the end portion of the conductor pattern 12a in plan view. The conductor patterns 12e, 12f, 13d, and 13e preferably have the same shape and size in plan view. That is, adjacent conductor patterns with a flexible base material layer being interposed therebetween in the stacking direction are shifted from each other in the longitudinal direction of the capacitor element 10 as viewed from the stacking direction.

The via conductor 14c that electrically couples the conductor patterns 12a, 12e, and 12f to each other is located in regions of the flexible base material layers 11b to 11g (in the rigid portion 16b) towards the side opposite to the flexible portion 15 (regions near the outer side of the capacitor element 10 in the rigid portion 16b). The via conductor 14c formed in the flexible base material layers 11b to 11g is disposed at corresponding positions as viewed from the stacking direction. As viewed from the stacking direction, the via conductor 14c is disposed within the conductor patterns 12a, 12e, and 12f and is disposed outside of the conductor patterns 13a and 13d.

The via conductor 14d that electrically couples the conductor patterns 13a, 13d, and 13e to each other is provided in regions of the flexible base material layers 11c to 11f (in the rigid portion 16b) towards the side of the flexible portion (regions near the inner side of the capacitor element 10 in the rigid portion 16b). The via conductor 14d provided in the flexible base material layers 11c to 11f is disposed at corresponding positions as viewed from the stacking direction. As viewed from the stacking direction, the via conductor 14d is disposed within the conductor patterns 13a, 13d, and 13e and is disposed outside of the conductor patterns 12e and 12f.

The conductor pattern 12e opposes the conductor patterns 13a and 13d. The conductor pattern 12f opposes the conductor patterns 13d and 13e. The conductor patterns 12a, 12e, and 12f are coupled to each other with the via conductor 14c being interposed therebetween. The conductor patterns 13a, 13d, and 13e are coupled to each other with the via conductor 14d being interposed therebetween. The conductor patterns 12a, 12e, and 12f provided in the rigid portion 16b and the conductor patterns 13a, 13d, and 13e provided in the rigid portion 16b define the conductor pattern pair 18b.

The conductor pattern pair 18b provided in the rigid portion 16 has a larger number of tiers than the conductor pattern pair 17 in the flexible portion 15. More specifically, whereas the conductor pattern pair 17 in the flexible portion 15 preferably has one tier, the conductor pattern pair 18b in the rigid portion 16b preferably has five tiers. This makes it possible for an opposing area of the conductor pattern pair 18b to be large. The conductor pattern pair 18b in the rigid portion 16b is connected in series with the conductor pattern pair 17 in the flexible portion 15.

Since the flexible portion 15 is thin, long, and is highly flexible, it is possible to use the flexible portion 15 as a flat cable provided with external connection terminals at two end portions thereof.

According to the first preferred embodiment, conductor pattern pairs are provided in the flexible portion 15 and the rigid portions 16a and 16b and the conductor pattern pairs provided in the rigid portions 16a and 16b have a larger number of tiers than the conductor pattern pair in the flexible portion 15. Therefore, it is possible to sufficiently increase the opposing area of the conductor pairs while suppressing or preventing a reduction in the flexibility of the flexible portion 15. As a result, it is possible for the capacitor to have high capacitance.

Figure 3:
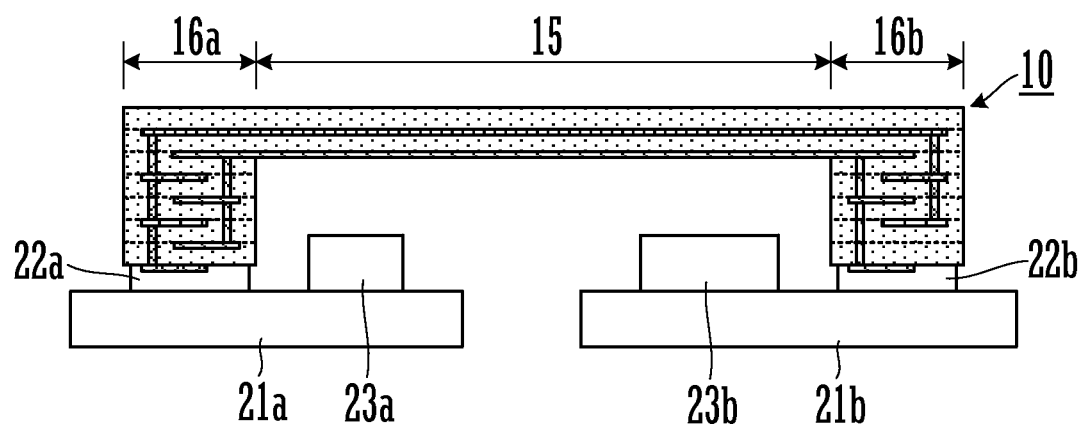
FIG. 3 is a sectional view of an example of an application of the capacitor element according to the first preferred embodiment of the present invention.

FIG. 3 is a sectional view of an example of an application of the capacitor element 10. The capacitor element 10 preferably is mounted between a mount board 21a and a mount board 21b such that the mount board 21a and the mount board 21b are connected to each other. A mount component 23a is mounted on the mount board 21a. A mount component 23b is mounted on the mount board 21b. In this way, it is possible to easily provide capacitance between the different mount boards (the mount board 21a and the mount board 21b) by using the capacitor element 10.

One of the external connection terminals of the capacitor element 10 is connected to a wire of the mount board 21a with a connector 22a being interposed therebetween. The other external connection terminal of the capacitor element 10 is connected to a wire of the mount board 21b with a connector 22b being interposed therebetween. This makes it possible to increase the reliability with which the capacitor element 10 is connected compared to the case in which the external connection terminals of the capacitor element 10 and the wires of the mount boards 21a and 21b are connected to each other with solder.

The flexible portion 15 extends between the mount board 21a and the mount board 21b so as to be separated from the mount board 21a by an amount equal or substantially equal to the thicknesses of the rigid portion 16a and the connector 22a and from the mount board 21b by an amount equal or substantially equal to the thicknesses of the rigid portion 16b and the connector 22b. The mount components 23a and 23b are disposed so as to overlap the flexible portion 15 in plan view. In this way, since, by using a space that is formed due to the difference between the thickness of the flexible portion 15 and the thickness of each of the rigid portions 16a and 16b, the mount components 23a and 23b are also able to be disposed below the flexible portion 15, and it is possible to dispose the mount components with high density.

The mount boards 21a and 21b may be disposed at different heights. Even in such a case, it is possible to mount the capacitor element 10 between the mount board 21a and the mount board 21b by bending the flexible portion 15.

Figure 4A:
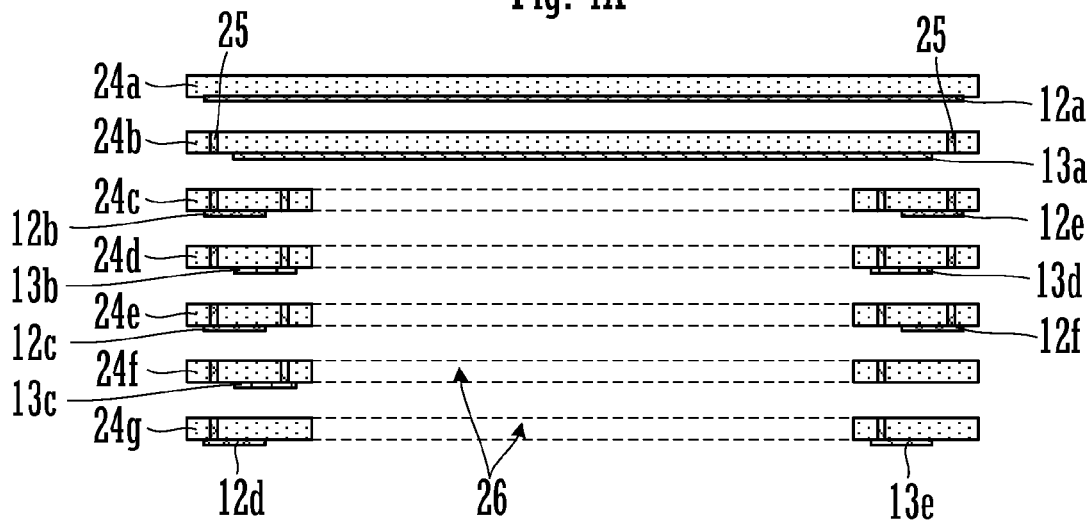
FIGS. 4A to 4C are sectional views showing a method for producing the capacitor element according to the first preferred embodiment of the present invention.
Figure 4B:
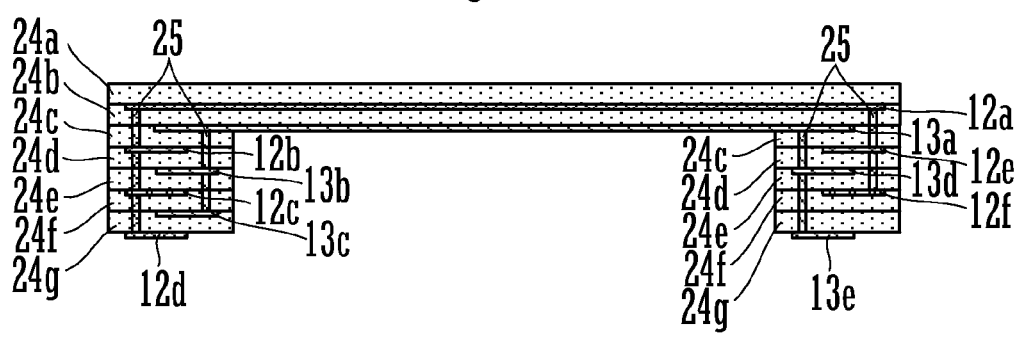
Figure 4C:
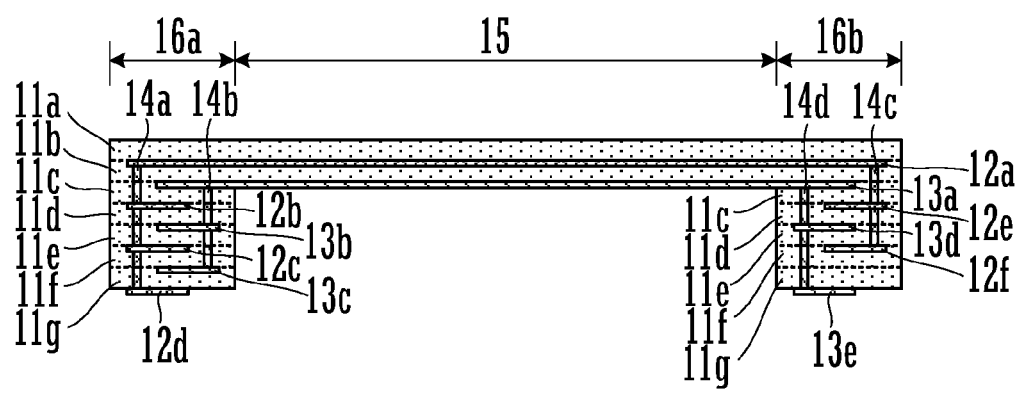

FIGS. 4A to 4C are sectional views showing a non-limiting example of a method for producing the capacitor element 10. The steps shown in FIGS. 4A to 4C are performed in a multi-sheet state in which the same structural portions are arranged. First, as shown in FIG. 4A, by using photolithography and etching technology, conductor patterns 12a to 12f and conductor patterns 13a to 13e are each formed at a proper location on a corresponding one of the flexible sheets 24a to 24g. For example, the flexible sheets 24a to 24g are each preferably formed of thermoplastic resin, such as liquid crystal polymer, and the conductor patterns 12a to 12f and the conductor patterns 13a to 13e are each preferably formed of a metallic film, such as a copper foil. By, for example, laser processing, via conductor holes are formed in the flexible sheets 24a to 24g, and the via conductor holes are filled with conductive paste 25. For example, the conductive paste 25 is formed of a conductive material whose main component is tin or silver. Openings 26 are formed in the flexible sheets 24c to 24g by, for example, cutting.

Next, as shown in FIG. 4B, the flexible sheets 24a to 24g that have been stacked upon each other are subjected to thermocompression bonding and pressing. This softens theparagraph thermoplastic resin of which each of the flexible sheets 24a to 24g is formed, so that the flexible sheets 24a to 24g are joined and integrated to each other. In this way, flexible base material layers 11a to 11g are formed. As viewed from the stacking direction, the portion where the openings 26 are formed becomes a flexible portion 15, and the other portions become rigid portions 16a and 16b. By solidifying the conductive paste 25 that fills the via conductor holes, via conductors 14a to 14d are formed, the conductor patterns 12a to 12d are joined to the via conductor 14a, the conductor patterns 13a to 13c are joined to the via conductor 14b, the conductor patterns 12a, 12e, and 12f are joined to the via conductor 14c, and the conductor patterns 13a, 13d, and 13e are joined to the via conductor 14d.

Finally, the multi-sheet in which a plurality of structural portions of the capacitor element 10 are arranged is cut, so that, as shown in FIG. 4C, the capacitor element 10 is completed.

Second Preferred Embodiment

Figure 5:
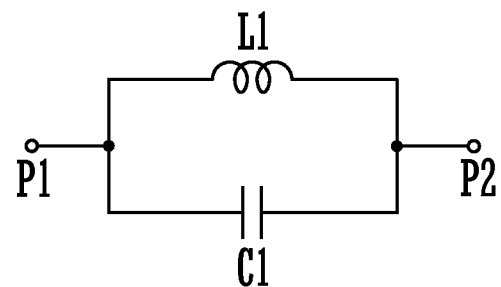
FIG. 5 is an equivalent circuit diagram of an LC composite element according to a second preferred embodiment of the present invention.

An LC composite element 30 according to a second preferred embodiment of the present invention is described. The LC composite element 30 is an example of an electronic component with a built-in capacitor. FIG. 5 is an equivalent circuit diagram of the LC composite element 30. By connecting a coil L1 and a capacitor C1 in parallel between an external connection terminal P1 and an external connection terminal P2, an LC parallel resonant circuit is provided. That is, an LC circuit includes the coil L1 and the capacitor C1. By subjecting the LC composite element 30 to shunt-connection, it is possible to use the LC composite element 30 as a band-pass filter, for example.

Figure 6:
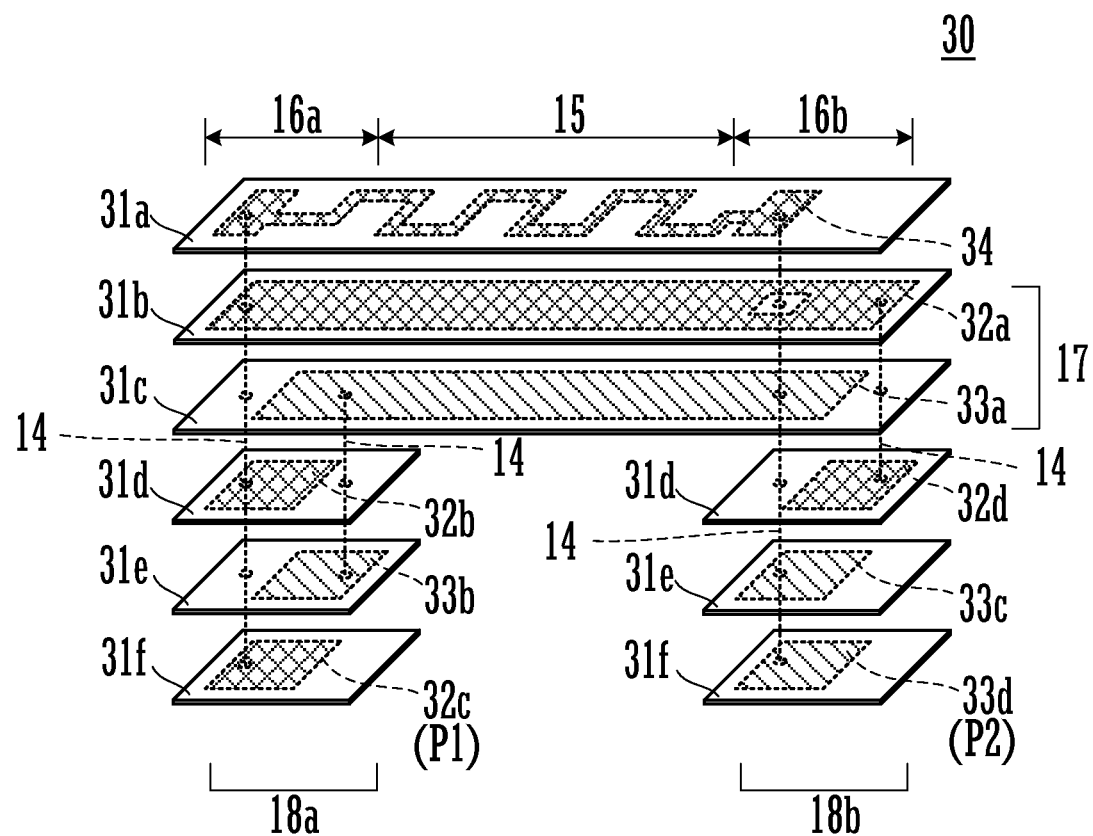
FIG. 6 is an exploded perspective view of the LC composite element according to the second preferred embodiment of the present invention.
Figure 7:
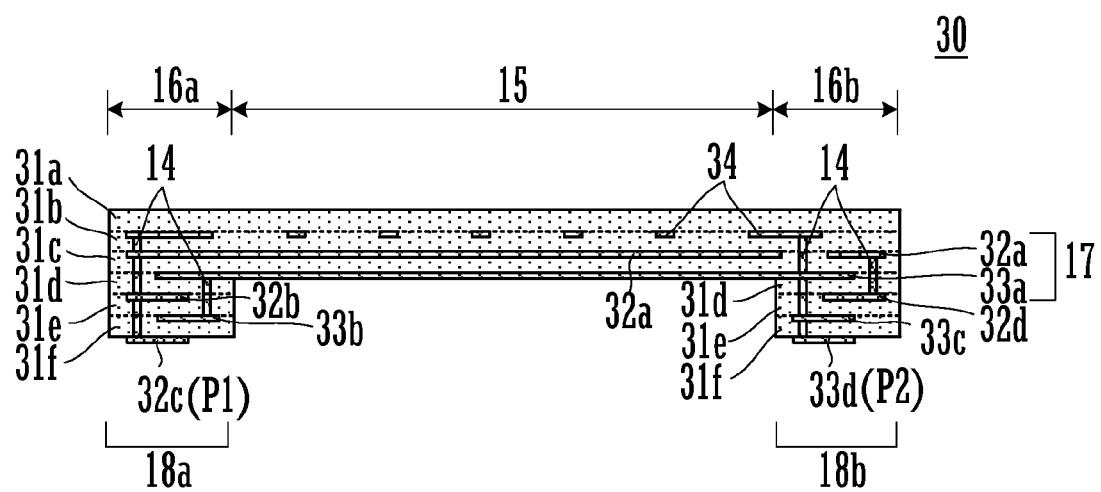
FIG. 7 is a sectional view of the LC composite element according to the second preferred embodiment of the present invention.

FIG. 6 is an exploded perspective view of the LC composite element 30. FIG. 7 is a sectional view of the LC composite element 30. The LC composite element 30 includes flexible base material layers 31a to 31f, conductor patterns 32a to 32d, conductor patterns 33a to 33d, a conductor pattern 34, and via conductors 14.

With the flexible base material layer 31a being the uppermost layer and the flexible base material layer 31f being the lowermost layer, the flexible base material layers 31a to 31f are stacked upon each other in that order. The LC composite element 30 includes a flexible portion 15 and rigid portions 16a and 16b having a larger number of stacked flexible base material layers than the flexible portion 15. In the flexible portion 15, three flexible base material layers 31a to 31c preferably are stacked upon each other, for example. In the rigid portions 16a and 16b, six flexible base material layers 31a to 31f preferably are stacked upon each other, for example.

The conductor pattern 34 in a meandering configuration is provided on a back surface of the flexible base material layer 31a. The conductor pattern 34 defines the coil L1 shown in FIG. 5. When the conductor pattern 34 has a meandering configuration, it is possible for the inductance of the coil L1 to be high. The conductor pattern corresponding to the coil L1 may be a winding pattern. Even in this case, it is possible for the inductance of the coil L1 to be high.

As in the first preferred embodiment, the rectangular or substantially rectangular flat conductor patterns 32a to 32d and 33a to 33d are each provided on a back surface of a corresponding one of the flexible base material layers 31b to 31f. The conductor patterns 32a to 32c and the conductor patterns 32a and 32d are coupled to each other by via conductors 14. The conductor patterns 33a and 33b and the conductor patterns 33a, 33c, and 33d are coupled to each other by via conductors 14. As in the first preferred embodiment, the conductor patterns 32a to 32d and 33a to 33d oppose each other with a corresponding one of the flexible base material layers 31c to 31f being interposed between opposing ones of the conductor patterns. This defines the capacitor C1 shown in FIG. 5.

That is, in the flexible portion 15 and the rigid portions 16a and 16b, conductor pattern pairs that define the capacitor C1 are provided when the conductor patterns oppose each other with a corresponding one of the flexible base material layers being interposed between opposing ones of the conductor patterns.

One end portion of the conductor pattern 34 is coupled to an end portion of the conductor pattern 32a by the via conductor 14. The other end portion of the conductor pattern 34 is coupled to an end portion of the conductor pattern 33a by the via conductor 14. By this, as shown in FIG. 5, the coil L1 and the capacitor C1 are connected in series. The conductor pattern 32c corresponds to an external connection terminal P1, and the conductor pattern 33d corresponds to an external connection terminal P2.

The conductor pattern 32a and the conductor pattern 33a define a conductor pattern pair 17. The conductor patterns 32a to 32c in the rigid portion 16a and the conductor patterns 33a and 33b in the rigid portion 16a define a conductor pattern pair 18a. The conductor patterns 32a and 32d in the rigid portion 16b and the conductor patterns 33a, 33c, and 33d in the rigid portion 16b define a conductor pattern pair 18b.

The conductor pattern pairs 18a and 18b in the rigid portions 16a and 16b, respectively, are connected in series with the conductor pattern pair 17 in the flexible portion 15. The conductor pattern pairs 18a and 18b in the rigid portions 16a and 16b, respectively, have a larger number of tiers than the conductor pattern pair 17 in the flexible portion 15. More specifically, whereas the conductor pattern pair 17 in the flexible portion 15 preferably has one tier, the conductor pattern pair 18a in the rigid portion 16a preferably has four tiers and the conductor pattern pair 18b in the rigid portion 16b preferably has three tiers.

In the second preferred embodiment, conductor pattern pairs are provided in the flexible portion 15 and the rigid portions 16a and 16b and the conductor pattern pairs provided in the rigid portions 16a and 16b preferably have a larger number of tiers than the conductor pattern pair in the flexible portion 15. Therefore, it is possible to sufficiently increase the opposing area of the conductor pattern pairs while suppressing or preventing a reduction in the flexibility of the flexible portion 15. As a result, it is possible for the capacitor to have high capacitance. In the second preferred embodiment, it is possible to provide a band-pass filter including a high-capacitance capacitor, for example.

Third Preferred Embodiment

Figure 8:
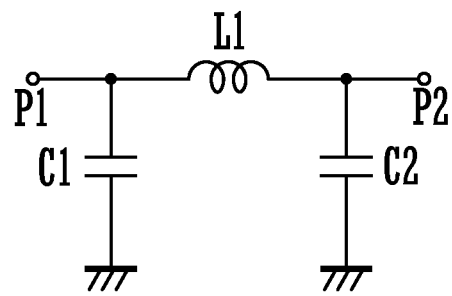
FIG. 8 is an equivalent circuit diagram of an LC composite element according to a third preferred embodiment of the present invention.

An LC composite element 40 according to a third preferred embodiment of the present invention is described. The LC composite element 40 is an example of an electronic component with a built-in capacitor. FIG. 8 is an equivalent circuit diagram of the LC composite element 40. By a coil L1 and capacitors C1 and C2, a π low-pass filter including external connection terminals P1 and P2 is provided. That is, by the coil L1 and the capacitors C1 and C2, an LC circuit is provided.

Figure 9:
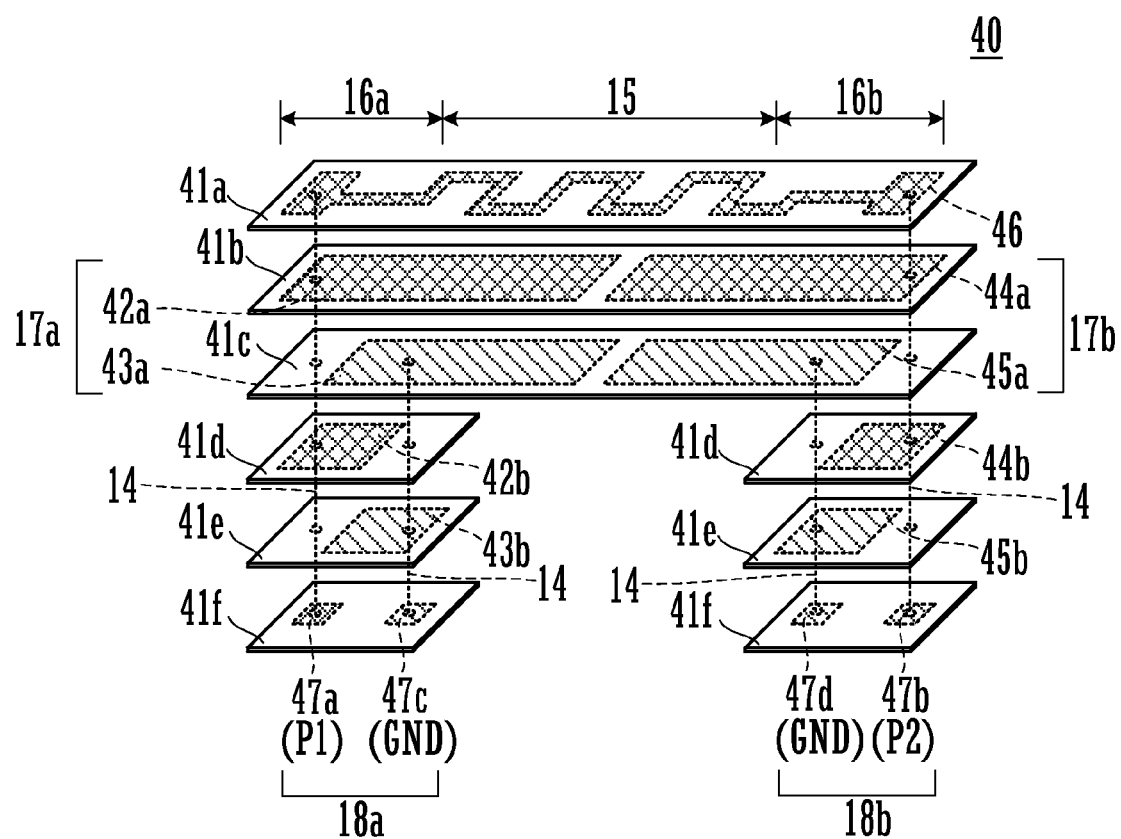
FIG. 9 is an exploded perspective view of the LC composite element according to the third preferred embodiment of the present invention.
Figure 10:
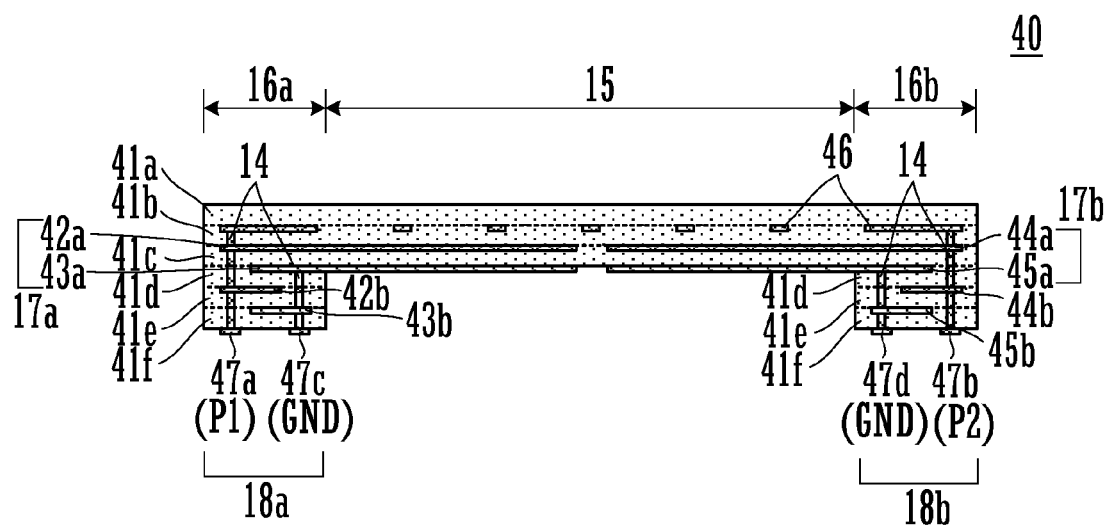
FIG. 10 is a sectional view of the LC composite element according to the third preferred embodiment of the present invention.

FIG. 9 is an exploded perspective view of the LC composite element 40. FIG. 10 is a sectional view of the LC composite element 40. The LC composite element 40 includes flexible base material layers 41a to 41f, conductor patterns 42a, 42b, 43a, 43b, 44a, 44b, 45a, 45b, 46, and 47a to 47d, and via conductors 14.

With the flexible base material layer 41a being the uppermost layer and the flexible base material layer 41f being the lowermost layer, the flexible base material layers 41a to 41f are stacked upon each other in that order. The LC composite element 40 includes a flexible portion 15 and rigid portions 16a and 16b having a larger number of stacked flexible base material layers than the flexible portion 15. In the flexible portion 15, three flexible base material layers 41a to 41c are preferably stacked upon each other, for example. In the rigid portions 16a and 16b, six flexible base material layers 41a to 41f preferably are stacked upon each other, for example.

The conductor pattern 46 in a meandering configuration is provided on a back surface of the flexible base material layer 41a. The conductor pattern 46 defines the coil L1 shown in FIG. 8.

The rectangular or substantially rectangular flat conductor patterns 42a and 44a are provided on a back surface of the flexible base material layer 41b. The rectangular or substantially rectangular flat conductor patterns 43a and 45a are provided on a back surface of the flexible base material layer 41c. The conductor patterns 42a and 43a are each provided in the flexible portion 15 and the rigid portion 16a, and oppose each other. The conductor patterns 44a and 45a are each provided in the flexible portion 15 and the rigid portion 16b, and oppose each other. As in the first preferred embodiment, the rectangular or substantially rectangular flat conductor patterns 42b and 44b are provided on a back surface of the flexible base material layer 41d, and the rectangular or substantially rectangular flat conductor patterns 43b and 45b are provided on a back surface of the flexible base material layer 41e. The conductor patterns 47a to 47d are provided on a back surface of the flexible base material layer 41f. The conductor pattern 47a corresponds to the external connection terminal P1 shown in FIG. 8. The conductor pattern 47b corresponds to the external connection terminal P2 shown in FIG. 8. The conductor patterns 47c and 47d are connected to ground when the LC composite element 40 is mounted.

The conductor patterns 42a, 42b, and 47a are coupled to each other by the via conductor 14. The conductor patterns 43a and 43b are coupled to each other by the via conductor 14. As in the first preferred embodiment, the conductor patterns 42a, 42b, and 47a and the conductor patterns 43a and 43b oppose each other with a corresponding one of the flexible base material layers 41c to 41f being interposed between opposing ones of the conductor patterns. This defines the capacitor C1 shown in FIG. 8.

That is, the conductor patterns 42a, 42b, 43a, 43b, and 47a are each provided on a corresponding one of the flexible base material layers 41b to 41f. The conductor patterns 42a, 42b, and 47a and the conductor patterns 43a and 43b oppose each other with a corresponding one of the flexible base material layers 41c to 41f being interposed between opposing ones of the conductor patterns, so that the capacitor C1 is provided. In both the flexible portion 15 and the rigid portion 16a, conductor pattern pairs that define the capacitor C1 are provided when the conductor patterns oppose each other with a corresponding one of the flexible base material layers being interposed opposing ones of the conductor patterns.

The conductor patterns 44a, 44b, and 47b are coupled to each other by the via conductor 14. The conductor patterns 45a and 45b are coupled to each other by the via conductor 14. As in the first preferred embodiment, the conductor patterns 44a, 44b, and 47b and the conductor patterns 45a and 45b oppose each other with a corresponding one of the flexible base material layers 41c to 41f being interposed between opposing ones of the conductor patterns. This provides the capacitor C2 shown in FIG. 8.

That is, the conductor patterns 44a, 44b, 45a, 45b, and 47b are each provided on a corresponding one of the flexible base material layers 41b to 41f. The conductor patterns 44a, 44b, and 47b and the conductor patterns 45a and 45b oppose each other with a corresponding one of the flexible base material layers 41c to 41f being interposed between opposing ones of the conductor patterns, so that the capacitor C2 is provided. In both the flexible portion 15 and the rigid portion 16b, conductor pattern pairs that define the capacitor C2 are provided when the conductor patterns oppose each other with a corresponding one of the flexible base material layers being interposed between opposing ones of the conductor patterns.

One end portion of the conductor pattern 46 is coupled to an end portion of the conductor pattern 42a by the via conductor 14. The other end portion of the conductor pattern 46 is coupled to an end portion of the conductor pattern 44a by the via conductor 14. The conductor pattern 47c is coupled to the conductor pattern 43b by the via conductor 14. The conductor pattern 47d is coupled to the conductor pattern 45b by the via conductor 14. These couplings correspond to the connections between the corresponding elements and terminals shown in FIG. 8.

The conductor pattern 42a and the conductor pattern 43a define a conductor pattern pair 17a. The conductor pattern 44a and the conductor pattern 45a define a conductor pattern pair 17b. The conductor patterns 42a, 42b, and 47a in the rigid portion 16a and the conductor patterns 43a and 43b in the rigid portion 16a define a conductor pattern pair 18a. The conductor patterns 44a, 44b, and 47b in the rigid portion 16b and the conductor patterns 45a and 45b in the rigid portion 16b define a conductor pattern pair 18b.

The conductor pattern pair 18a in the rigid portion 16a is connected in series with the conductor pattern pair 17a in the flexible portion 15. The conductor pattern pair 18b in the rigid portion 16b is connected in series with the conductor pattern pair 17b in the flexible portion 15. The conductor pattern pairs 18a and 18b in the rigid portions 16a and 16b, respectively, preferably have a larger number of tiers than the conductor pattern pairs 17a and 17b in the flexible portion 15. More specifically, whereas the conductor pattern pairs 17a and 17b in the flexible portion 15 preferably have one tier, the conductor pattern pairs 18a and 18b in the respective rigid portions 16a and 16b preferably have four tiers.

In the third preferred embodiment, conductor pattern pairs are provided in the flexible portion 15 and the rigid portions 16a and 16b and the conductor pattern pairs provided in the rigid portions 16a and 16b preferably have a larger number of tiers than the conductor pattern pairs in the flexible portion 15. Therefore, it is possible to sufficiently increase the opposing area of the conductor pairs while suppressing or preventing a reduction in the flexibility of the flexible portion 15. As a result, it is possible for the capacitors to have high capacitance. In the third preferred embodiment, it is possible to provide a low-pass filter including high-capacitance capacitors, for example.

Fourth Preferred Embodiment

Figure 11:
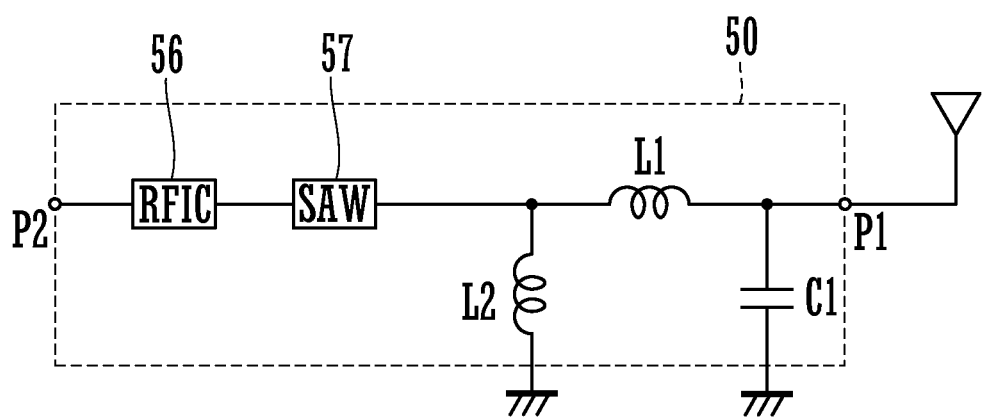
FIG. 11 is an equivalent circuit diagram of an RF module according to a fourth preferred embodiment of the present invention.

A radio frequency (RF) module 50 according to a fourth preferred embodiment of the present invention is described. The RF module 50 is an example of an electronic component with a built-in capacitor. FIG. 11 is an equivalent circuit diagram of the RF module 50. The RF module 50 includes an RFIC 56, a surface acoustic wave (SAW) filter 57, coils L1 and L2, a capacitor C1, and external connection terminals P1 and P2. The external connection terminal P1 is connected to, for example, an antenna. One end of the coil L1 is connected to the external connection terminal P1, and a connection point between the coil L1 and the external connection terminal P1 is connected to ground by the capacitor C1. The other end of the coil L1 is connected to the SAW filter 57, and a connection point between the coil L1 and the SAW filter 57 is connected to ground by the coil L2. The circuit including the coils L1 and L2 and the capacitor C1 is a matching circuit in which the antenna side and the SAW-filter-57 side are matched. The RFIC 56 is connected to the SAW filter 57 and the external connection terminal P2. The RFIC 56 transmits and receives high-frequency signals.

Figure 12:
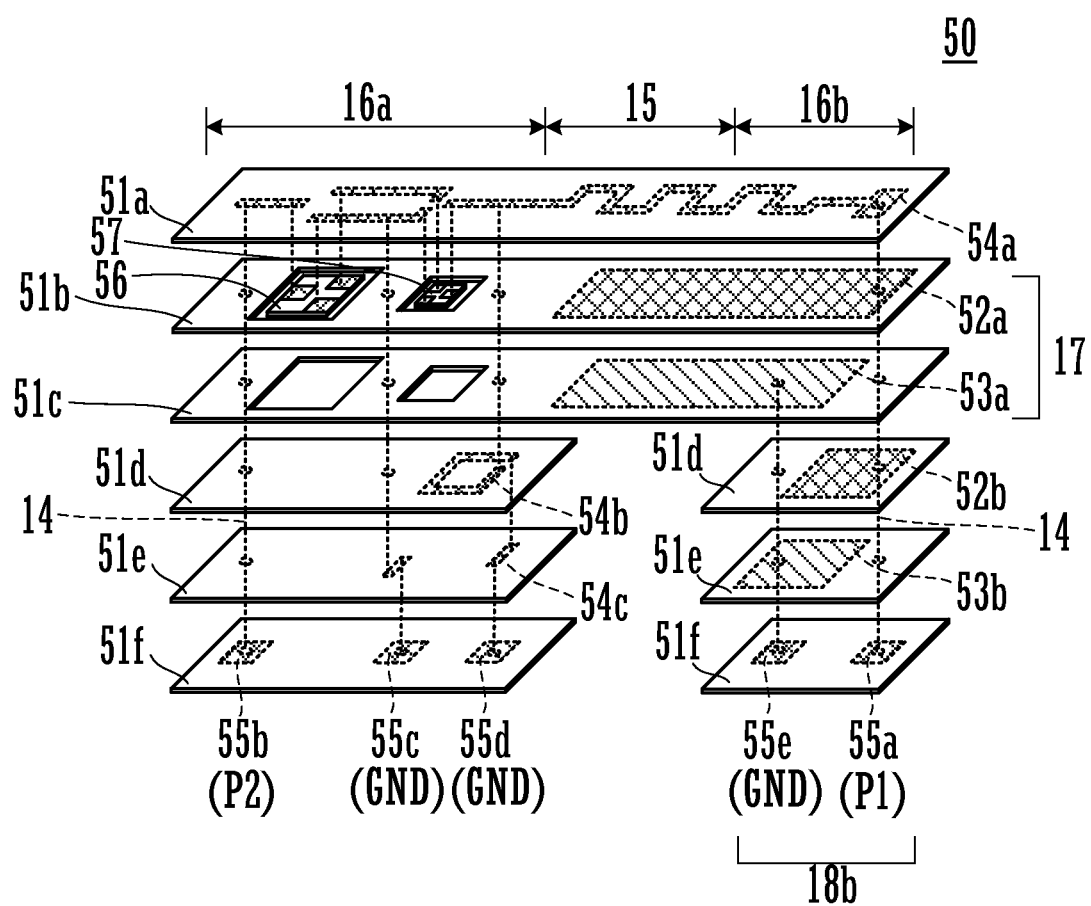
FIG. 12 is an exploded perspective view of the RF module according to the fourth preferred embodiment of the present invention.
Figure 13:
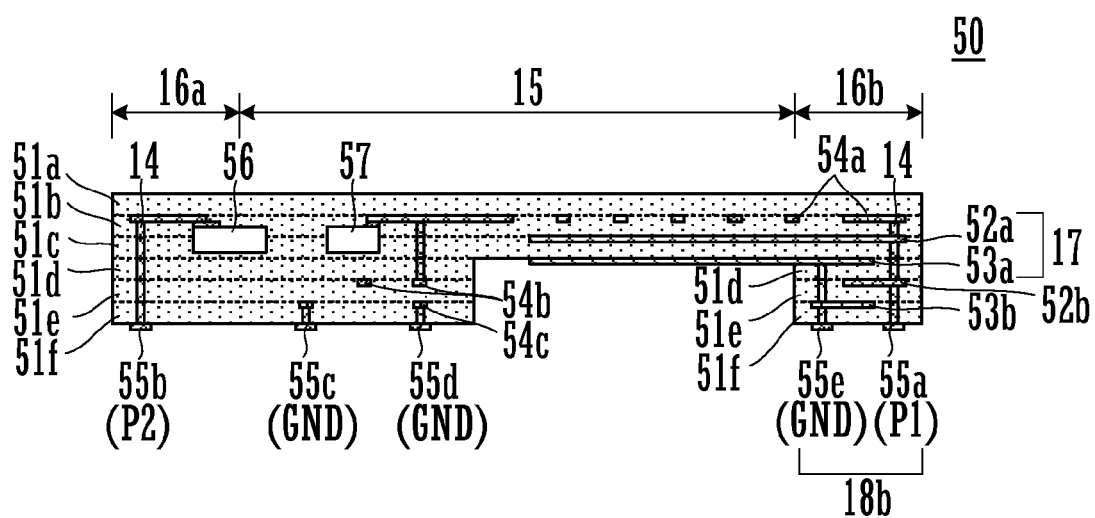
FIG. 13 is a sectional view of the RF module according to the fourth preferred embodiment of the present invention.

FIG. 12 is an exploded perspective view of the RF module 50. FIG. 13 is a sectional view of the RF module 50. The RF module 50 includes flexible base material layers 51a to 51f, conductor patterns 52a, 52b, 53a, 53b, 54a to 54c, and 55a to 55e, the RFIC 56, the SAW filter 57, and via conductors 14. The RFIC 56 and the SAW filter 57 are each an example of an electronic component.

With the flexible base material layer 51a being the uppermost layer and the flexible base material layer 51f being the lowermost layer, the flexible base material layers 51a to 51f are stacked upon each other in that order. The RF module 50 includes a flexible portion 15 and rigid portions 16a and 16b having a larger number of stacked flexible base material layers than the flexible portion 15. In the flexible portion 15, three flexible base material layers 51a to 51c preferably are stacked upon each other. In the rigid portions 16a and 16b, six 3 flexible base material layers 51a to 51f preferably are stacked upon each other.

The conductor pattern 54a in a meandering configuration is provided on a back surface of the flexible base material layer 51a. The conductor pattern 54a defines the coil L1 shown in FIG. 11. The conductor pattern 54b in a spiral configuration is provided on a back surface of the flexible base material layer 51d in the rigid portion 16a. The conductor pattern 54c in a linear configuration is provided on a back surface of the flexible base material layer 51e in the rigid portion 16a. By coupling the conductor patterns 54b and 54c by using the via conductor 14, the coil L2 shown in FIG. 11 is provided.

As in the first preferred embodiment, the rectangular or substantially rectangular flat conductor patterns 52a, 52b, 53a, and 53b are each provided on a back surface of a corresponding one of the flexible base material layers 51b to 51e. The conductor patterns 55a to 55e are provided on a back surface of the flexible base material layer 51f. The conductor pattern 55a corresponds to the external connection terminal P1 shown in FIG. 11. The conductor pattern 55b corresponds to the external connection terminal P2 shown in FIG. 11. The conductor patterns 55c to 55e are connected to ground when mounting the RF module 50. The conductor patterns 52a, 52b, and 55a are coupled to each other by the via conductor 14. The conductor patterns 53a and 53b are coupled to each other by the via conductor 14. As in the first preferred embodiment, the conductor patterns 52a, 52b, and 55a and the conductor patterns 53a and 53b oppose each other with a corresponding one of the flexible base material layers 51c to 51e being interposed between opposing ones of the conductor patterns. This defines the capacitor C1 shown in FIG. 11.

In both the flexible portion 15 and the rigid portion 16b, conductor pattern pairs that define the capacitor C1 are provided when the conductor patterns oppose each other with a corresponding one of the flexible base material layers being interposed between opposing ones of the conductor patterns.

Openings are provided in the flexible base material layers 51b and 51c. The openings are consecutively provided with each other to define cavities. The cavities are disposed in the rigid portion 16a. The RFIC 56 and the SAW filter 57 are accommodated in the cavities. That is, the RFIC 56 and the SAW filter 57 are built in the rigid portion 16a.

This makes it possible to provide the RFIC 56 and the SAW filter 57 without increasing the wall thickness of the flexible portion 15. Therefore, it is possible to obtain an RF module while maintaining the flexibility of the flexible portion 15. By disposing the RFIC 56 and the SAW filter 57 in the rigid portion 16a, it is possible to suppress or prevent the occurrence of improper joining or detachment of the RFIC 56 and the SAW filter 57 caused by deformation of the base material.

The conductor patterns, the RFIC 56, and the SAW filter 57 are coupled to each other by the via conductors 14 and connection line conduction patterns so as to define the equivalent circuit shown in FIG. 11.

The conductor patterns 52a and 53a define a conductor pattern pair 17. The conductor patterns 52a, 52b, and 55a provided in the rigid portion 16b and the conductor patterns 53a and 53b provided in the rigid portion 16b define a conductor pattern pair 18b.

The conductor pattern pair 18b provided in the rigid portion 16b is connected in series with the conductor pattern pair 17 provided in the flexible portion 15. The conductor pattern pair 18b provided in the rigid portion 16b preferably has a larger number of tiers than the conductor pattern pair 17 in the flexible portion 15. More specifically, whereas the conductor pattern pair 17 in the flexible portion 15 preferably has one tier, the conductor pattern pair 18b in the rigid portion 16b preferably has four tiers.

In the fourth preferred embodiment, conductor pattern pairs are provided in the flexible portion 15 and the rigid portions 16a and 16b and the conductor pattern pairs provided in the rigid portions 16a and 16b preferably have a larger number of tiers than the conductor pattern pair in the flexible portion 15. Therefore, it is possible to sufficiently increase the opposing area of the conductor pairs while suppressing or preventing a reduction in the flexibility of the flexible portion 15. As a result, it is possible for the capacitor to have high capacitance.

Fifth Preferred Embodiment

Figure 14:
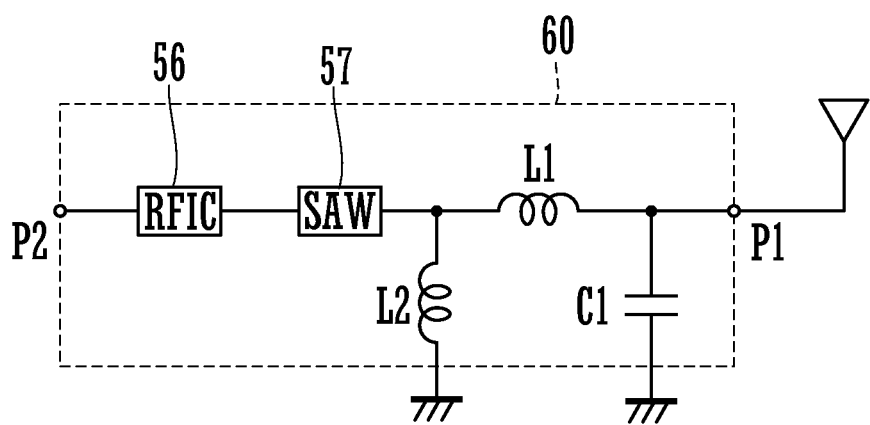
FIG. 14 is an equivalent circuit diagram of an RF module according to a fifth preferred embodiment of the present invention.

An RF module 60 according to a fifth preferred embodiment of the present invention is described. The RF module is an example of an electronic component with a built-in capacitor. FIG. 14 is an equivalent circuit diagram of the RF module 60. The RF module 60 includes an RFIC 56, a surface acoustic wave (SAW) filter 57, a coil L1, a capacitor C1, and external connection terminals P1 and P2. The external connection terminal P1 is connected to, for example, an antenna. One end of the coil L1 is connected to the external connection terminal P1, and a connection point between the coil L1 and the external connection terminal P1 is connected to ground by the capacitor C1. The other end of the coil L1 is connected to the SAW filter 57. A connection point between the coil L1 and the SAW filter 57 is connected to ground by a via hole. Therefore, the connection point is connected to the ground by an inductor component of the via hole, so that the connection point between the coil L1 and the SAW filter 57 has a predetermined impedance (L2) from the ground. The circuit including the coil L1 and the capacitor C1 is a matching circuit in which the antenna side and the SAW-filter-57 side are matched. The RFIC 56 is connected to the SAW filter 57 and the external connection terminal P2.

Figure 15:
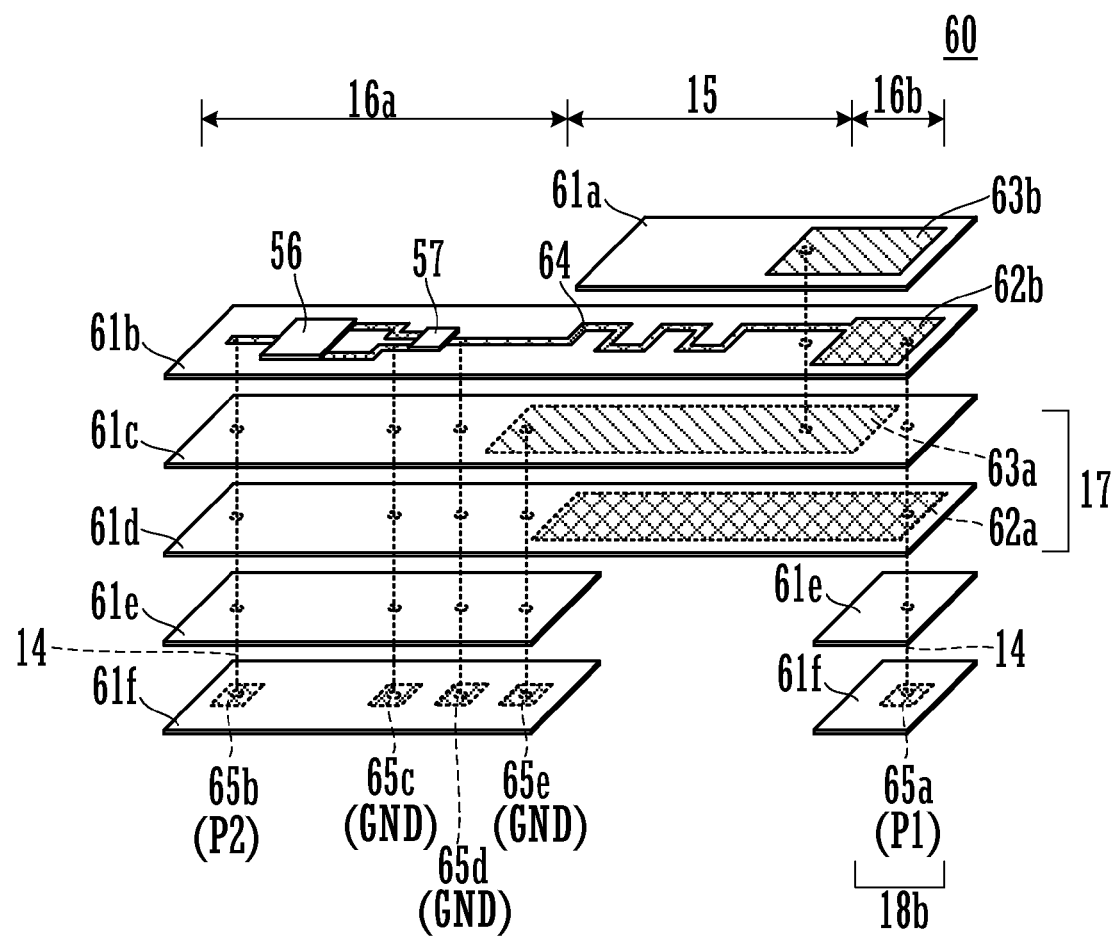
FIG. 15 is an exploded perspective view of the RF module according to the fifth preferred embodiment of the present invention.
Figure 16:
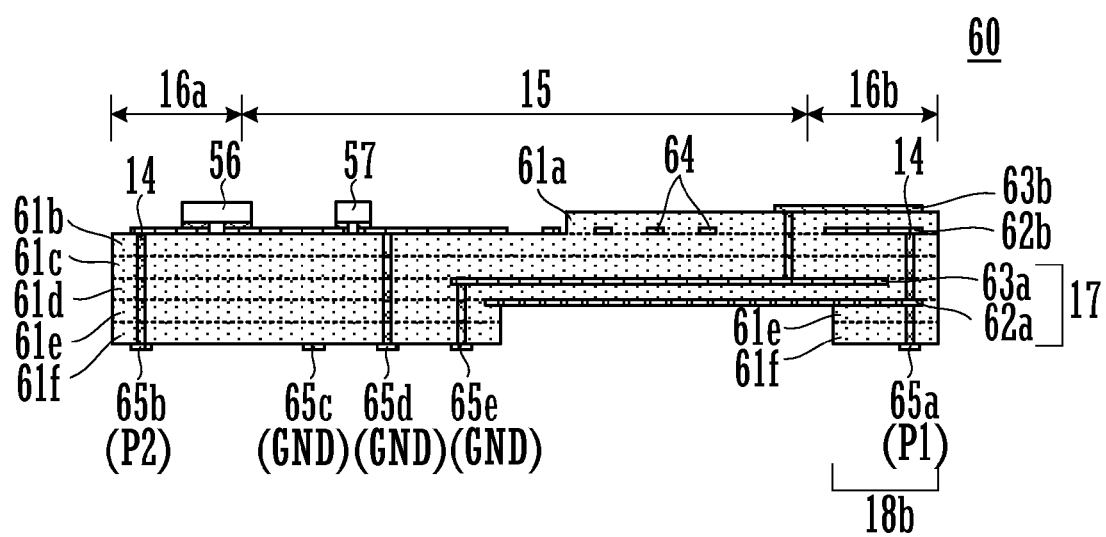
FIG. 16 is a sectional view of the RF module according to the fifth preferred embodiment of the present invention.

FIG. 15 is an exploded perspective view of the RF module 60. FIG. 16 is a sectional view of the RF module 60. The RF module 60 includes flexible base material layers 61a to 61f, conductor patterns 62a, 62b, 63a, 63b, 64, and 65a to 65e, via conductors 14, the RFIC 56, and the SAW filter 57.

With the flexible base material layer 61a being the uppermost layer and the flexible base material layer 61f being the lowermost layer, the flexible base material layers 61a to 61f are stacked upon each other in that order. The RF module 60 includes a flexible portion 15 and rigid portions 16a and 16b having a larger number of stacked flexible base material layers than the flexible portion 15. In the flexible portion 15, four flexible base material layers 61a to 61d are stacked upon each other. In the rigid portion 16a, five flexible base material layers 61b to 61f are stacked upon each other. In the rigid portion 16b, six flexible base material layers 61a to 61f are stacked upon each other.

The rectangular or substantially rectangular flat conductor pattern 63b is provided on a front surface of the flexible base material layer 61a. The rectangular or substantially rectangular flat conductor pattern 62b and the conductor pattern 64 in a meandering configuration are provided on a front surface of the flexible base material layer 61b. The conductor pattern 62b and the conductor pattern 64 are integrated with each other. The conductor pattern 64 defines the coil L1 shown in FIG. 14.

The rectangular or substantially rectangular flat conductor pattern 63a is provided on a back surface of the flexible base material layer 61c. The rectangular or substantially rectangular flat conductor pattern 62a is provided on a back surface of the flexible base material layer 61d. The conductor patterns 62a and 63a are each provided in the flexible portion 15 and the rigid portion 16b. The conductor patterns 65a to 65e are provided on a back surface of the flexible base material layer 61f. The conductor pattern 65a corresponds to the external connection terminal P1 shown in FIG. 14. The conductor pattern 65b corresponds to the external connection terminal P2 shown in FIG. 14. The conductor patterns 65c to 65e are connected to ground when mounting the RF module 60. The conductor patterns 62a, 62b, and 65a are coupled to each other by the via conductor 14. The conductor patterns 63a and 63b are coupled to each other by the via conductor 14. As in the first preferred embodiment, the conductor patterns 62a, 62b, and 65a and the conductor patterns 63a and 63b oppose each other with a corresponding one of the flexible base material layers 61a to 61f being interposed between opposing ones of the conductor patterns. This defines the capacitor C1 shown in FIG. 14.

That is, in both the flexible portion 15 and the rigid portion 16b, conductor pattern pairs that define the capacitor C1 are provided when the conductor patterns oppose each other with a corresponding one of the flexible base material layers being interposed between opposing ones of the conductor patterns.

The RFIC 56 and the SAW filter 57 are mounted on the front surface of the flexible base material layer 61b. The RFIC 56 and the SAW filter 57 are disposed in the rigid portion 16a. That is, the RFIC 56 and the SAW filter 57 are mounted on a front side of the rigid portion 16a.

The conductor patterns, the RFIC 56, and the SAW filter 57 are coupled to each other by the via conductors 14 and connection line conduction patterns so as to define the equivalent circuit shown in FIG. 14.

The conductor patterns 62a and 63a define a conductor pattern pair 17. The conductor patterns 62a, 62b, and 65a in the rigid portion 16b and the conductor patterns 63a and 63b in the rigid portion 16b define a conductor pattern pair 18b.

The conductor pattern pair 18b in the rigid portion 16b is connected in series with the conductor pattern pair 17 in the flexible portion 15. The conductor pattern pair 18b in the rigid portion 16b preferably have a larger number of tiers than the conductor pattern pair 17 in the flexible portion 15. More specifically, whereas the conductor pattern pair 17 in the flexible portion 15 preferably have one tier, the conductor pattern pair 18b in the rigid portion 16b preferably have three tiers.

In the fifth preferred embodiment, conductor pattern pairs are provided in the flexible portion 15 and the rigid portions 16a and 16b and the conductor pattern pairs in the rigid portions 16a and 16b preferably have a larger number of tiers than the conductor pattern pair in the flexible portion 15. Therefore, it is possible to sufficiently increase the opposing area of the conductor pattern pairs while suppressing a reduction in the flexibility of the flexible portion 15. As a result, it is possible for the capacitor to have high capacitance.

Although, in the above-described preferred embodiments, rigid portions are provided at two end portions of the flexible portion, the present invention is not limited to such preferred embodiments. A rigid portion may be provided at only one end portion of the flexible portion.

Although, in the first to fourth preferred embodiments of the present invention, the heights of the rigid portions (number of layers) provided in the two end portions of the flexible portion preferably are the same, the present invention is not limited thereto. As in the fifth preferred embodiment, the heights (number of layers) of the rigid portions may differ from each other. When one of the principal surfaces of the electronic component with a built-in capacitor is flat and the other principal surface thereof is uneven, the heights (number of layers) of the rigid portions may differ from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component with a built-in capacitor, comprising:
   a plurality of flexible base material layers that are stacked upon each other;
   conductor patterns that are provided on the flexible base material layers and define a capacitor;
   a flexible portion; and
   a thick-walled portion having a larger number of stacked flexible base material layers than the flexible portion; wherein
   in both the flexible portion and the thick-walled portion, conductor pattern pairs that define the capacitor are provided when the conductor patterns oppose each other with a corresponding one of the flexible base material layers being interposed between opposing ones of the conductor patterns; and
   the conductor pattern pair that is provided in the thick-walled portion is connected in series with the conductor pattern pair that is provided in the flexible portion, and the conductor pattern pair that is provided in the thick-walled portion has a larger number of tiers than the conductor pattern pair that is provided in the flexible portion.

2. The electronic component with a built-in capacitor according to claim 1, wherein the conductor pattern pair that is provided in the flexible portion extends from the flexible portion to the thick-walled portion, and the conductor pattern pair that is provided in the flexible portion defines a portion of the conductor pattern pair that is provided in the thick-walled portion.

3. The electronic component with a built-in capacitor according to claim 1, wherein
the flexible portion is belt-shaped; and
as viewed from a stacking direction, the flexible portion is provided with the conductor pattern pair over substantially an entire region in a longitudinal direction of the flexible portion.

4. The electronic component with a built-in capacitor according to claim 1, wherein
at least two of the thick-walled portions are provided;
the flexible portion is disposed between the at least two thick-walled portions so as to connect the at least two thick-walled portions to each other; and
an external connection terminal is provided in each of the at least two thick-walled portions.

5. The electronic component with a built-in capacitor according to claim 1, wherein a portion of the conductor pattern pair that is provided in the thick-walled portion defines an external connection terminal.

6. The electronic component with a built-in capacitor according to claim 1, further comprising a coil, wherein the capacitor and the coil define an LC circuit.

7. The electronic component with a built-in capacitor according to claim 1, wherein an electronic component is mounted on or built in the thick-walled portion.

8. The electronic component with a built-in capacitor according to claim 1, wherein the conductor pattern pair in the flexible portion extends over substantially the entire surface of the flexible portion as viewed from the stacking direction.

9. The electronic component with a built-in capacitor according to claim 1, wherein the conductor patterns in the thick-walled portion have a same size and a same shape as each other.

10. The electronic component with a built-in capacitor according to claim 1, wherein the electronic component is an LC composite element.

11. The electronic component with a built-in capacitor according to claim 1, wherein at least one of the conductor patterns has a meandering configuration.

12. The electronic component with a built-in capacitor according to claim 1, wherein the electronic component is a $\pi$ low-pass filter.

13. The electronic component with a built-in capacitor according to claim 1, wherein at least one of the conductor patterns has a rectangular or substantially rectangular flat configuration.

14. The electronic component with a built-in capacitor according to claim 1, wherein at least two of the conductor patterns are connected by at least one via conductor.

15. The electronic component with a built-in capacitor according to claim 1, wherein the electronic component is an RF module.

16. The electronic component with a built-in capacitor according to claim 15, wherein the RF module includes an RFIC and a surface acoustic wave filter.

17. The electronic component with a built-in capacitor according to claim 1, wherein at least one of the conductor patterns has a spiral configuration and at least another one of the conductor patterns has a linear configuration.

18. A component mounting structure comprising:
the electronic component with a built-in capacitor according to claim 1;
a first mount board; and
a second mount board; wherein
the first mount board and the second mount board are connected by the capacitor.

19. The component mounting structure according to claim 18, wherein the flexible portion extends between the first mount board and the second mount board so as to be separated from the first mount board by an amount equal or substantially equal to a thicknesses of the thick-walled portion and a connector.

20. The component mounting structure according to claim 18, wherein the first mount board and the second mount board are disposed at different heights.

* * * * *